US006360900B1

(12) United States Patent
Carbonneau et al.

(10) Patent No.: US 6,360,900 B1
(45) Date of Patent: Mar. 26, 2002

(54) DATA STORAGE CHASSIS WITH ADJUSTABLE RACK MOUNTING

(75) Inventors: Guy A. Carbonneau, Winter Springs; Larry G. Kibler, St. Cloud, both of FL (US)

(73) Assignee: NSTOR Corporation, San Diego, CA (US)

( * ) Notice: Subject to any disclaimer, the term of this patent is extended or adjusted under 35 U.S.C. 154(b) by 0 days.

(21) Appl. No.: 09/670,117

(22) Filed: Sep. 26, 2000

(51) Int. Cl.[7] .................................................. A47F 5/00
(52) U.S. Cl. ...................... 211/26; 312/265.4; 312/350; 361/683
(58) Field of Search ............................ 211/26; 361/829, 361/683; 312/265.1–265.6, 350

(56) References Cited

U.S. PATENT DOCUMENTS

| | | | | |
|---|---|---|---|---|
| 2,789,024 A | * | 4/1957 | Heisler | |
| 4,558,789 A | | 12/1985 | Troutner | 211/107 |
| 5,398,821 A | * | 3/1995 | Vansant | 211/26 |
| 5,571,256 A | * | 11/1996 | Good et al. | 211/26 |
| 5,865,126 A | | 2/1999 | Miranda | 108/91 |
| 5,894,941 A | | 4/1999 | Woodruff | 211/41.12 |
| 5,895,102 A | | 4/1999 | Fleisch | 312/334.6 |
| 5,915,803 A | | 6/1999 | Daugherty et al. | 312/263 |
| 5,941,621 A | * | 8/1999 | Boulay et al. | |
| 5,971,507 A | * | 10/1999 | Peroni | 211/26 X |
| 5,984,442 A | | 11/1999 | Hellman, Jr. | 312/334.12 |
| 6,015,053 A | | 1/2000 | Sheng | 211/188 |
| 6,030,060 A | | 2/2000 | Drake | 312/205 |
| 6,039,177 A | | 3/2000 | Swanson et al. | 206/306 |
| 6,042,206 A | | 3/2000 | Bowyer et al. | 312/350 |
| 6,065,612 A | * | 5/2000 | Rinderer | 211/26 |
| 6,123,203 A | * | 9/2000 | Gibbons | 211/26 |
| 6,181,549 B1 | * | 1/2001 | Mills et al. | 361/683 |
| 6,185,092 B1 | * | 2/2001 | Landrum et al. | 361/683 |
| 6,220,456 B1 | * | 4/2001 | Jensen et al. | 211/26 |
| 6,230,903 B1 | * | 5/2001 | Abbott | 211/26 |
| 6,269,959 B1 | * | 8/2001 | Haworth | 211/26 |

* cited by examiner

Primary Examiner—Robert W. Gibson, Jr.
(74) Attorney, Agent, or Firm—Dan Hubert & Assoc.

(57) ABSTRACT

An adjustable system for mounting data storage chassis allows chassis of differing depths to be mounted to a single set of rack mount posts. The front face of the chassis is attached to two front posts. One or more rails are then slidably inserted into the chassis and attached a corresponding number of rear posts. In one embodiment, two narrow, elongated rails are slidably adjusted into guide paths each comprising two, open and opposing brackets affixed internally to the chassis. The rails are then attached to two corresponding rear posts. In another embodiment, a single, wide rail is slidably adjusted into a single guide path at the bottom of the chassis and is then attached to one of the rear posts.

20 Claims, 7 Drawing Sheets

DATA STORAGE CHASSIS WITH ADJUSTABLE RACK MOUNTING

BACKGROUND OF THE INVENTION

1. Field of the Invention

This invention relates to data storage enclosures that provide housing and access to hard drives, control electronics, power supplies, cooling equipment, and other storage-related support electronics and equipment.

2. Description of the Related Art

Rectangular box-shaped metal chassis of differing depths are universally used for the storage and ready accessibility of magnetic disk drive storage media. Typically, the chassis' body is mounted with screws to four surrounding rack mount posts forming a storage rack. As installed, the chassis is accessible at its front and back for viewing, replacement, repair and monitoring of its contents.

There is currently no industry standard for the depth of such chassis or the storage racks. A smaller chassis often is preferred based on the size of the equipment stored in the chassis and/or because it is more portable. A small size chassis is not deep enough to be mounted to a larger-sized storage rack, limiting its installation to small size storage racks only. The need to purchase racks of different sizes results in extra expense accompanied by a need for additional storage space to fit the varying sizes of storage racks and chassis. This situation also results in chassis boxes of different sizes being spread out, instead of being mounted together in one conveniently located storage rack.

SUMMARY OF THE INVENTION

The invention is directed to an apparatus for adjustably mounting a data storage chassis and a method of mounting the apparatus to rack mount posts.

The apparatus comprises a box-shaped chassis having opposing front and rear faces, each of the faces having opposing sides, and opposing top and bottom ends. The rear face of the chassis has at least one rail opening therein. For each rail opening, the chassis includes a rail-receiving guide path internal to the chassis and coupled to the corresponding rail opening. Residing within the guide path is a corresponding rail, slidably dispensable to couple the rail to the chassis. Each rail's exterior end includes a respective adapter for attachment to a predefined rack mount post.

The method of mounting a data storage chassis comprises positioning the box-shaped chassis between three or four rack mount posts, including two front rack mount posts, and one or two rear rack mount posts. The front face of the chassis is connected to the front rack mount posts. Each rail is inserted into a rail opening in the rear face leading to a guide path within the chassis, and then each rail is then slidably adjusted to a desired position within its guide path(s). The chassis is secured by attaching the rail(s) to the respective rear rack mount post(s).

This invention avoids the otherwise inconvenient need to install storage racks of varying depths to accommodate chassis of varying depths. The present invention's adjustable rack mount system uses slidable rails to accommodate chassis of differing depths, which are often preferred depending on the size of the magnetic disk drive storage or other contents. Accordingly, a smaller size chassis may be conveniently, quickly, safely and securely mounted to larger storage racks because the rails, once extended out of the guide paths and mounted to the rack, hold the chassis in place and support the weight of the contents of the chassis as if the rear face of the chassis were itself connected to the rack.

Consequently, with this invention, there is no need to purchase and accommodate multiple sets of storage racks for different sizes of chassis, because chassis of different sizes may be adjustably mounted on the same set of racks. As a result, the invention further obviates the expense of purchasing and installing multiple sets of storage racks to accommodate chassis of differing depths. On the other hand, if a facility already has racks of various sizes, the chassis with this invention can be easily adjusted to fit any of them. The invention also provides various further advantages as described below.

DETAILED DESCRIPTION

The nature, objectives, and advantages of the invention will become more apparent to those skilled in the art after considering the following detailed description in connection with the accompanying drawings.

1. Description of Dual-Rail Embodiment

The following description generally involves an adjustable rack mount system using two rails, and will be referred to as the "dual-rail embodiment."

A. Chassis

Figure 1:
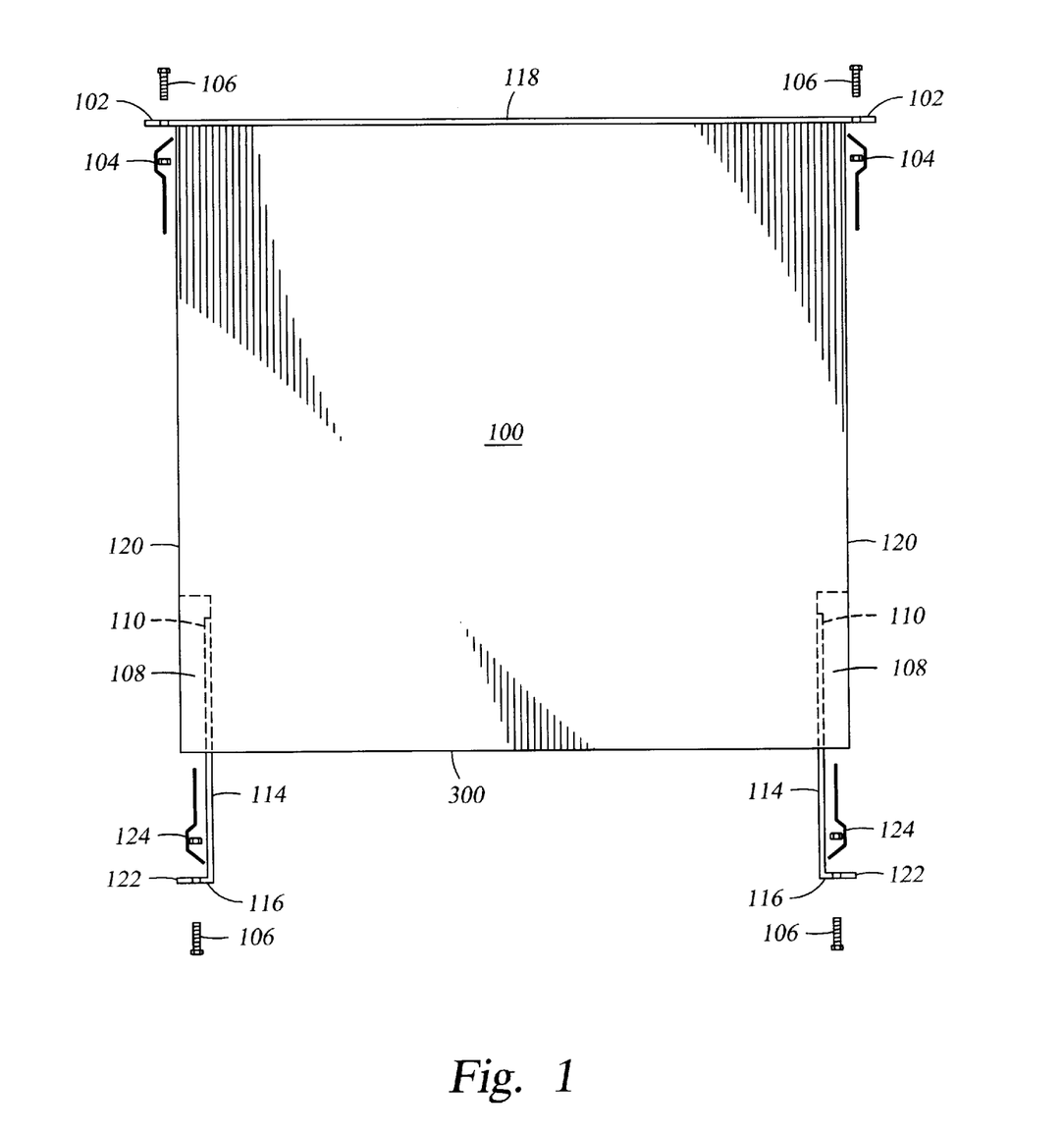
FIG. 1 is a top plan view of the data storage chassis showing opposing rails partially extended from respective guide paths and attached to front and rear rack mount posts, according to the invention.

Referring to FIG. 1, the invention includes a generally box-shaped chassis 100 used for storing magnetic disk drive storage media and the like, which may be adjustably mounted to a set of four rack mount posts, including two opposing front rack mount posts 104 and two opposing rear rack mount posts 124. The chassis 100 may consist of sheet metal, plastic, composite material, fiberglass, or any other material capable of maintaining the weight of the chassis' 100 contents when mounted to the front 104 and rear 124 rack mount posts. The chassis includes front 118 and rear 300 faces.

Figure 2:
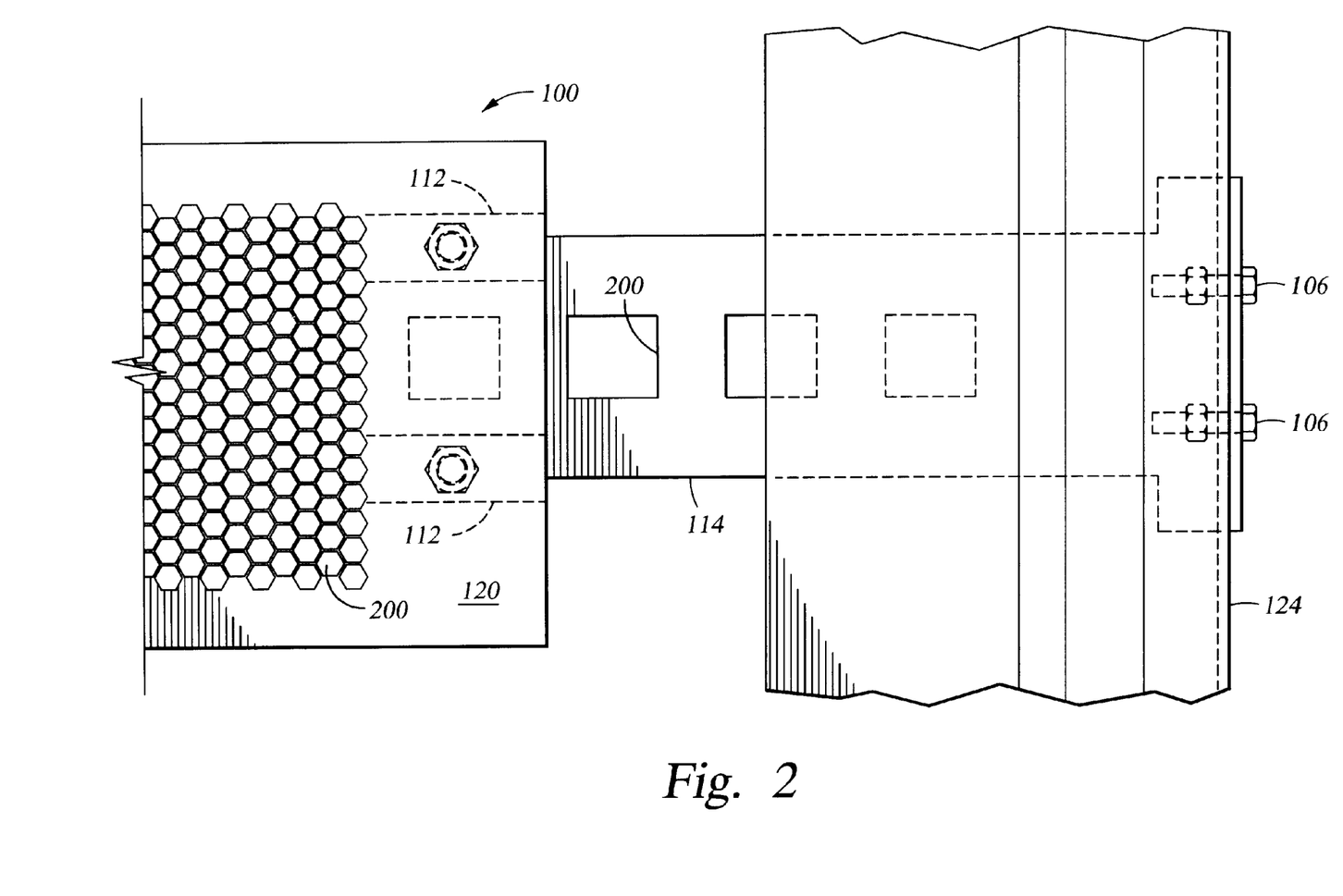
FIG. 2 is a partial side plan view of a rail held by brackets, extended from the guide path internal to the chassis, and attached to a rear rack mount post, according to the invention.
Figure 3:
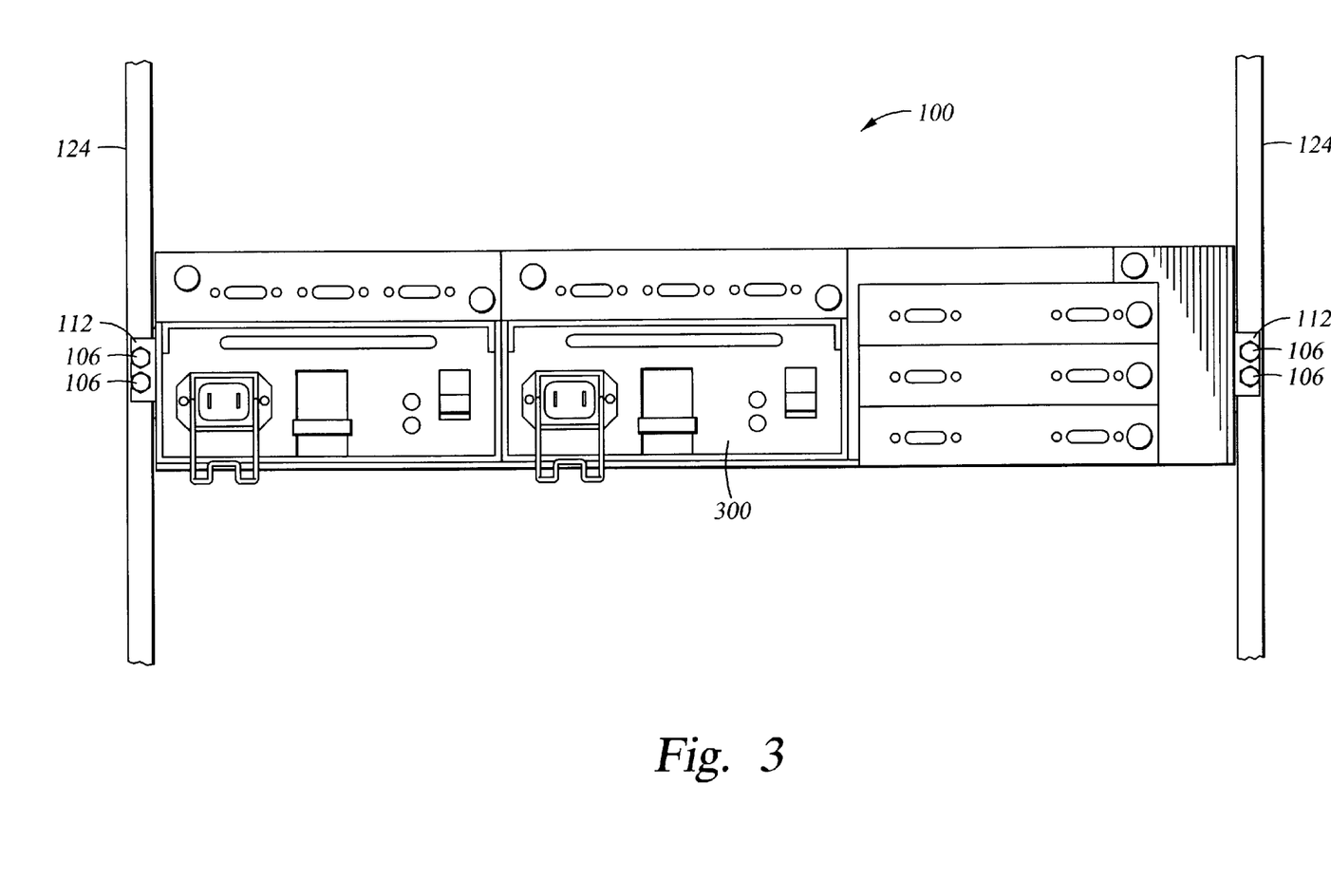
FIG. 3 is a rear plan view of the chassis showing opposing rails attached to rear rack mount posts, according to the invention.
Figures 4, 4A:
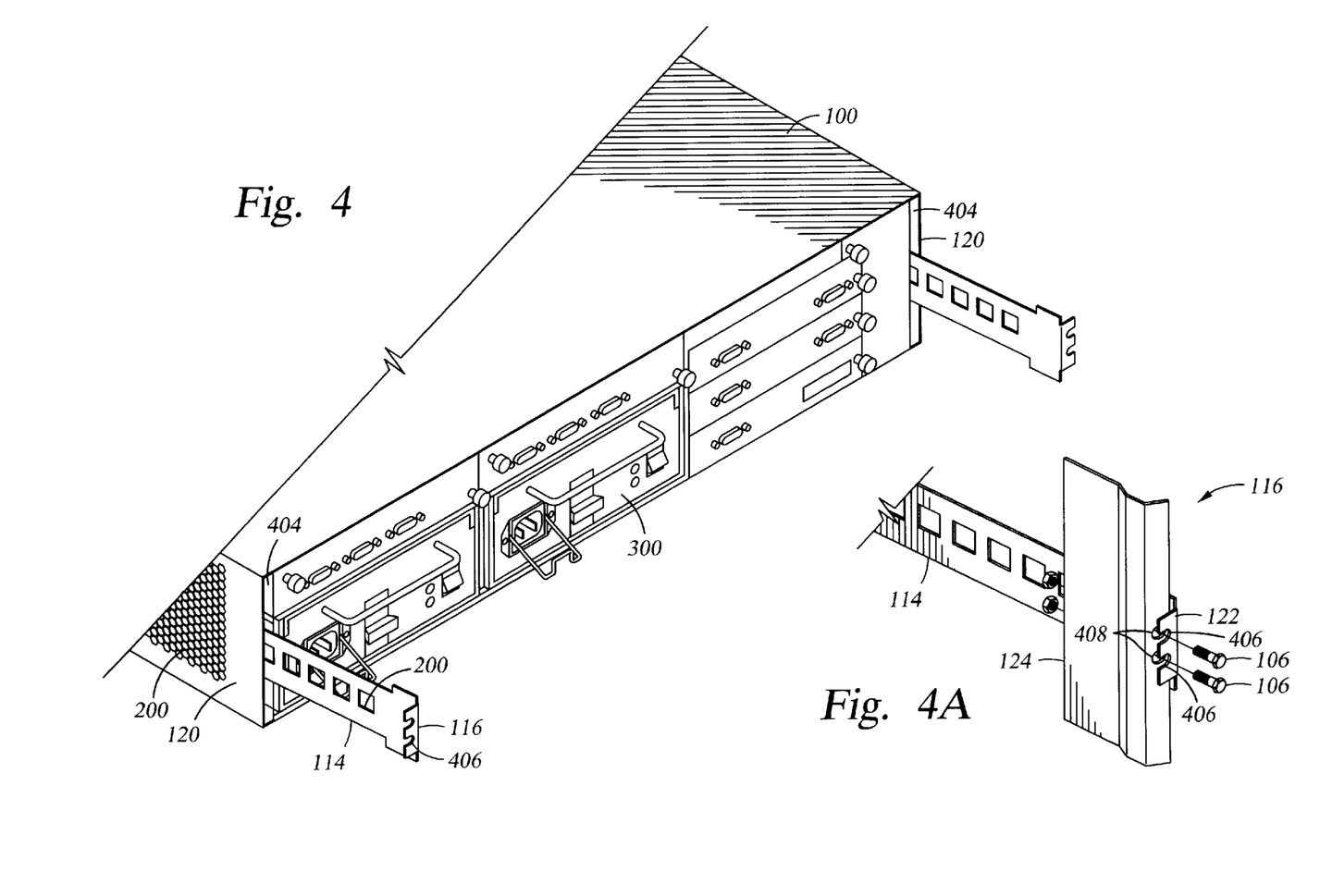
FIG. 4 is a partial rear perspective view of the rear face of the chassis showing rails partially extended from rail openings, according to the invention.
FIG. 4(a) is an exploded rear perspective view showing an L-shaped adapter on the exterior end of one of the rails of FIG. 4 abutting the rear rack mount post and ready for attachment, according to the invention.

Referring to FIGS. 1, 3–4, the rear face 300 of the chassis 100 may be open for easy access to storage components data inside, but the invention does not preclude the front 118 or the rear face 300 of the chassis 100 from being closed and/or locked for security, safe transport, or other reasons. In the illustrated embodiment, the chassis' rear face 300 is occupied by a number of removably modular data storage components housed within the chassis 100. In addition to the front and rear faces 118/300, the chassis 100 includes opposing sides 120. The opposing sides 120 of the chassis 100 may optionally define perforations 200 (FIG. 2), for reasons explained below. As explained in greater detail below, opposing rail openings 404 are defined in the rear face 300, as best shown in FIG. 4. The rail openings 404 lead to guide paths 108 internal to the chassis 100 as discussed below.

B. Guide Paths

Referring to FIGS. 1 and 4, in the dual-rail embodiment the two rail openings 404 lead to rail-receiving guide paths 108, internal to the chassis 100. The guide paths 108 are designed to hold rails 114 (discussed below) in place when distal ends of the rails 114 are inserted inside the rail openings 404. Opposite the rails' distal ends, the rails are slidably dispensed outward of the chassis 100 as desired for attachment of their proximal ends to rear rack mount posts 124.

Figure 6A:
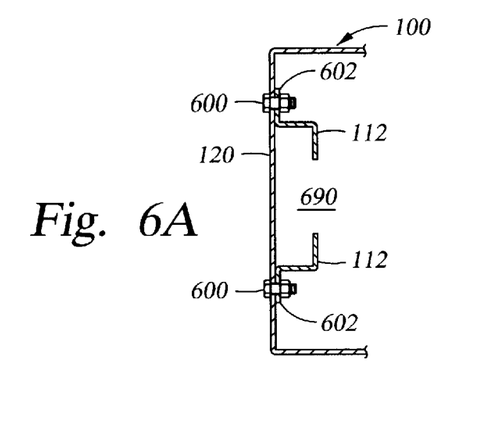
FIG. 6(a) is a partial end view of the rear face of the chassis showing opposing open brackets forming a guide path, according to the invention.

FIG. 6(a) illustrates one embodiment of guide path 108, comprising of a set of opposing, open brackets 112 attached by machine screw 600 internally to the side 120 of the chassis 100. As illustrated, the brackets 112 may be stepshaped when held horizontally and viewed from the rear. Base sections 602 of the bracket 112 may be attached to the side 120 of the chassis 100 by screws, riveting or any other secure method. The brackets 112, once installed, oppose each other, creating an intervening opening 690 that forms the guide path 108 and serves to receive a rail 114.

Referring to FIG. 1, the brackets 112 may proceed from the rear face 300 into the chassis 100 to a distance of approximately half the length of the corresponding rail 114, but may be longer or shorter in length, provided the rails 114, as inserted in the brackets 112, can support the weight of the chassis when partially extended out of the guide paths 108. The brackets 112 permit the rails 114 to be completely detached from the chassis 100. This allows the rails 114 to be easily and fully inserted into, and removed from, the brackets 112 during mounting and demounting as discussed below. The brackets 112 may be made of sheet metal or any other material capable of withstanding the weight of the chassis 100 when the rails 114 are inserted inside the brackets 112, and partially slidably dispensed outward of the chassis 100 as desired for attachment to the rear rack mount posts 124.

Figure 6B:
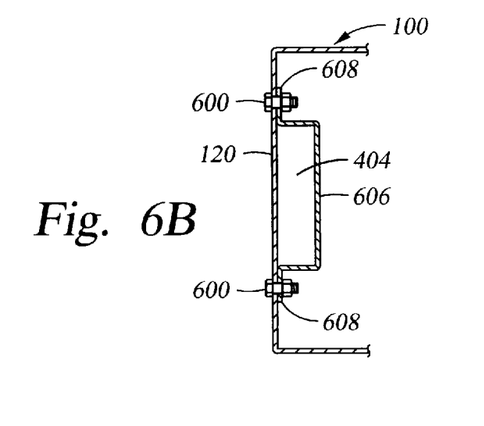
FIG. 6(b) is a partial end view of the rear face of the chassis showing a closed bracket forming a guide path, according to the invention.

Referring to FIG. 6(b), an alternative guide path 108 may comprise an enclosed bracket 606 attached to the side 120 of the chassis 100. As opposed to the paired stepshaped open brackets 112 (FIG. 6(a)), the closed bracket 606 is a single bracket that has a general "U" shape when held horizontally and viewed from the rear. Base sections 608 of the closed bracket 606 may be attached to the side 120 of the chassis 100 by screws, riveting or any other secure method. Once installed, the closed bracket 606 extends from the rear face 300 inwardly inside the chassis 100 to some depth, creating an elongated, narrow enclosure. A closed bracket 606 is installed against each side 120 of the chassis 100 to create opposing guide paths. Each closed bracket 606 may also be perforated (not shown) for airflow and easier adjustment as the rail 114 is slidably adjusted therein.

As with the open brackets 112, the closed bracket 606 may be approximately half the length of the corresponding rail 114, but may be longer or shorter in length provided the rails 114, as inserted inside the closed bracket, may support the weight of the chassis 100 when partially extended out of the guide paths 108. The closed brackets 606 permit the rails 114 to be completely detached from the chassis 100, allowing the rails 114 to be easily and fully inserted into, and removed from, the closed brackets 606 during mounting or demounting, as discussed below. As with the open brackets, the closed brackets 606 may be made of sheet metal or any other material capable of withstanding the weight of the chassis 100 when the rails 114 are inserted inside the closed brackets 606, and partially slidably dispensed outward of the chassis 100 as desired for attachment to the rear rack mount posts 124. Furthermore, the closed brackets 606 may assume any shape that corresponds to the cross-sectional shape of the rail 114, whether the rail 114 is rectangular, circular, triangular, or of another cross-sectional shape.

Figure 6C:
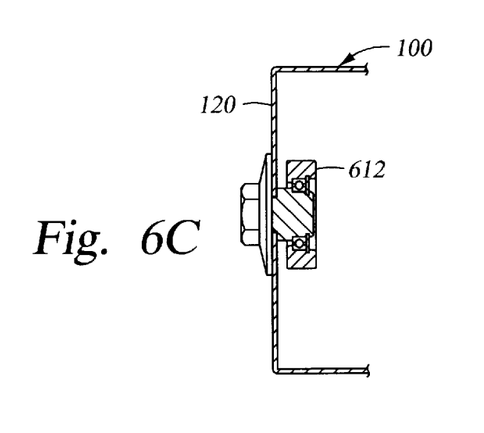
FIG. 6(c) is a partial end view of the rear face of the chassis showing an exemplary roller disc defining a guide path, according to the invention.
Figure 7A:
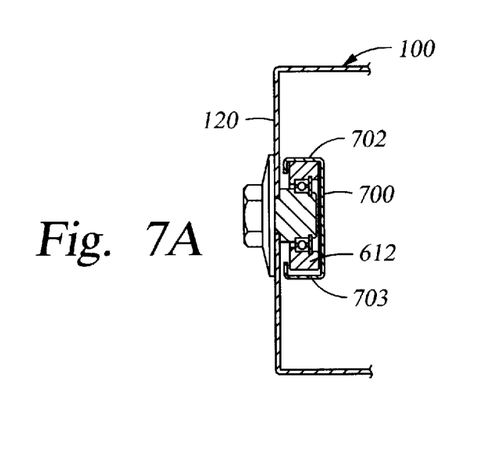
FIG. 7(a) is a partial, cutaway end view of the rear face of the chassis showing a bent rail wrapped around a roller disc (the adapter at the exterior end of the rail not shown), according to the invention.

Referring to FIGS. 6(c) and 7(a), another alternative guide path 108 comprises a set of two or more roller discs (such as the sole illustrated disc 612) aligned in linear fashion and attached internally to the one sides 120 of the chassis 100. Each set of discs 612 accommodates a corresponding rail that rests upon, wraps around, slides over, or otherwise slidably travels along the guide path defined by these roller discs. One set of such discs is mounted to each of the sides 120 internal to the chassis. The discs 612 may be circular and narrow and may be attached to the side 120 of the chassis 100 in any manner that allows the disc 612 to rotate, such as ball bearings within the disc and radially distributed about a central hub. As further discussed below (FIG. 7(a)), this embodiment may employ a rail 700 that is bent to form top 702 and bottom 703 edges that wrap around, and rest upon the rotating discs 612.

As with the open 112 and closed 606 brackets, each rotating disc 612 allows its respective rail 700 to be fully withdrawn from the chassis 100. The rotating discs may be made of any material capable of withstanding the weight of the chassis 100 when the rails 700 are coupled to the rotating discs 612, and slidably dispensed outward of the chassis 100 as desired for attachment to the rear rack mount posts 124. Furthermore, the rotating discs 612 may be any shape that corresponds to the shape of the rail 700.

Figure 6D:
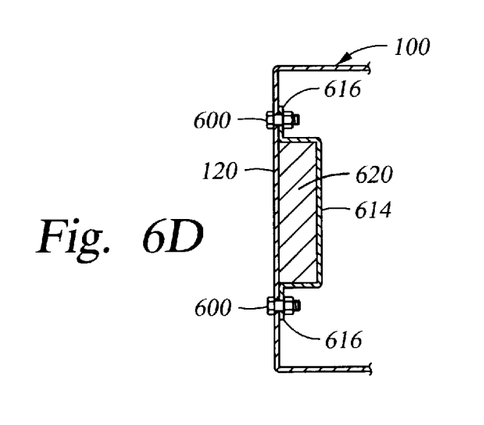
FIG. 6(d) is a partial end view of the rear face of the chassis showing a shaft forming a guide path, according to the invention.
Figure 7B:
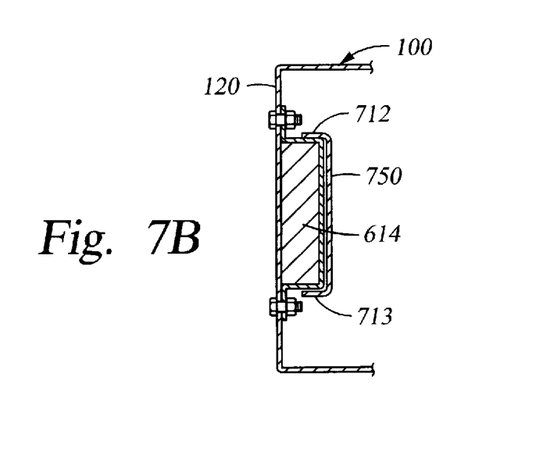
FIG. 7(b) is a partial end view of the rear face of the chassis showing a bent rail wrapped around the rail shaft (the adapter at the exterior end of the rail not shown), according to the invention.

Referring to FIGS. 6(d) and 7(b), another alternative guide path 108 comprises one or more shafts 614 attached to the sides 120 of the chassis 100. As with the closed bracket 606, the shaft 614 has base sections 616 for attachment by machine screw, riveting, or other secure means, to the side 120 of the chassis 100. In contrast to the closed bracket 606, the shaft 614 may have an interior 620 that is either hollow or solid. This is because the rail 750 for this embodiment, as discussed below (FIG. 7 (b)), wraps around the exterior of the shaft 614.

As with the open 112 and closed 606 brackets, the shafts 614 may be approximately half the length of the corresponding rails 750, but may be longer or shorter in length provided the rails 750 provide support for the weight of the chassis 100 when partially extended out of the chassis 100. The shafts 614 allow the rails 750 to be completely detached from the chassis 100, if desired.

As with the open 112 and closed 606 brackets, the shafts 614 may be made of sheet metal or any other material capable of withstanding the weight of the chassis 100 when the rails 750 are inserted inside the chassis 100 over the shafts 614, and partially slidably dispensed outward of the chassis 100 as desired for attachment to the rear rack mount posts 124. Furthermore, the shafts 614 may be any shape that corresponds to the shape of the rails 750, whether the rails 750 are rectangular, circular, or of another shape.

C. Rails

Referring again to the dual-rail embodiment as shown in FIGS. 1–4, the invention includes opposing narrow, elongated, rails 114, each rail having opposing interior 110 and exterior 116 ends. In this embodiment, the rails 114 may be narrow, elongated and flat except at their exterior end 116, as discussed below. The rails 114 may also include perforations (not shown) to permit airflow through the rails and lessen their weight. The perforations in the rail 114, and the perforations 200 in the sides 120 of the chassis 100, allow for displacement of air within the guide paths 108 as the rails 114 are inserted into, or slidably dispensed outward, of the chassis 100. The displacement of air provides for smoother and more graduated adjustments of the rails 114. The rails 114 may consist of sheet metal or any material capable of maintaining the weight of the chassis 100 when the rails are partially extended out of the guide paths 108.

Referring to FIGS. 1, 2, 4 and 6(a), in the dual-rail embodiment the rail 114, when inserted into the rail opening 404 slidably resides within its respective guide path 108, which is defined by opposing, open brackets 112 in the case of FIG. 6(a). The width of the rail 114 may correspond to the width of the opening between the brackets 112 such that when the rails 114 are partially slidably dispensed outward of the chassis 100, the chassis 100 remains level. Also, the rails 114 may be completely detached from the chassis 100 by sliding the rails 114 all the way out of the rail openings 404.

Referring to FIG. 6(b), in an alternative embodiment rails 114 are inserted into guide paths 108 each defined by a closed bracket 606. As in the previous embodiment, the rails 114 may be narrow, elongated, and flat. The rails 114 also may be perforated, and may consist of sheet metal or any material capable of maintaining the weight of the chassis 100 when the rails are partially extended out of the guide paths 108.

In the closed bracket 606 embodiment, as in the open bracket embodiment, the rail 114 slidably resides within its respective guide path 108 comprising a single, closed bracket 606 (FIG. 6(b)).

Referring to FIGS. 6(c) and 7(a), another dual-rail embodiment includes rails 700 that may be bent to comprise a top 702 and bottom 703 edge which may be wrapped around, and rest upon, two or more roller discs 612 attached internally to the opposing sides 120 of the chassis 100. This arrangement permits the rail 700 to slidably move in/out of the chassis 100 as guided by the linear guide path defined by the discs 612. As with the previous embodiment, the bent rail 700 is free to be completely withdrawn from the chassis 100. Furthermore, the bent rail 700 may be any shape that corresponds to the shape of the corresponding roller discs 612 and may even be perforated.

Referring to FIGS. 6(d) and 7(b), another alternative embodiment may comprise a rail 750 that also may be bent to comprise a top 712 and bottom 713 edge, but which may be wrapped around, and rest upon, a corresponding shaped shaft 614 attached internally to the opposing sides 120 of the chassis 100. As with the previous embodiment, the bent rail 750 may be withdrawn and completely detached from the chassis 100. Furthermore, the bent rail 750 may be any shape that corresponds to the shape of the corresponding shaft 614 and may be perforated.

D. Adapters For Attachment To Rack Mount Posts

Referring to FIGS. 1 and 4, the exterior ends 116 of the rails 114 may include adapters for attachment to rear rack mount posts 124. Specifically, as shown in FIG. 4(a), each exterior end 116 includes an L-shaped adapter 122 that may be adjusted flush with the rear rack mount post 124 by sliding the rail. Thereafter, the adapter 122 may be attached to the rack mount post 124 by machine screw 106 inserted through the adapter 122 and into the rear rack mount post 124. When attaching the rail 114 to the rear of the rack mount post 124, the person installing the data storage chassis may stand behind the rack posts and thus more easily insert the machine screws 106 through the L-shaped adapter 122 into the rear rack mount post 124.

The adapters 122 may instead utilize pins, rods, bolts, built-in screws, clips, brackets, sliding collars, or any other mechanism that securely attaches the exterior end 116 of the rail 114 to the rear rack mount post 124. Alternatively, the rear rack mount posts 124 themselves may be modified with pins, rods, bolts, built-in screws, clips, brackets, sliding collars, slits, holes, or any other mechanism that would allow the rear rack mount post 124 to be securely coupled to the rail 114 and thereby support the chassis 100.

A different set of adapters, referred to herein as rack mount ears 102, may be used to attach the front face 118 of the chassis 100 to respective front rack mount posts 104. Referring to FIG. 1, rack mount ears 102 may be mounted to the chassis 100 proximate the front face 118. In one embodiment, the rack mount ears 102 may extend away from the front face 118 of the chassis 100. As with the L-shaped adapter 122, the ears 102 may be shaped for wrapping around the front rack mount posts 104 and for attachment by machine screw 106. As shown in FIG. 1, the front face 118 of the chassis 100 may be mounted to rack mount posts 104 by machine screw 106 inserted through the rack mount ears 102 and into the rack mount posts 104. Alternatively, the rack mount ears 102 may comprise pins, rods, bolts, built-in screws, clips, brackets, sliding collars, and any mechanism that securely attaches the front face 118 of the chassis 100 to the front rack mount posts 104. The front rack mount posts 104 also may be modified with pins, rods, bolts, built-in screws, clips, brackets, sliding collars, slits, holes, or any mechanism to securely couple the front rack mount post 104 to the chassis 100 and thereby provide support for the chassis 100.

Referring to FIGS. 3, 4(a), the rails 114 may be mounted to the rear rack mount posts 124 by insertion of machine screws 106 against indentations 406 in the adapters 122 on the exterior ends 116 of the rails 114, and thereafter through holes 408 in the rack mount post 124. The adapter 122 on each rail 114 may be slidably adjusted flush with a rear rack mount post 124. This embodiment allows for installation of the chassis 100 in any rack despite variations in distance between the front 104 and rear 124 rack mount posts.

2. Operation of Dual-Rail Embodiment (FIG. 8)

Having described the structural features of the dual-rail embodiment of the present invention, the method aspect of this embodiment invention will now be described.

Figure 8:
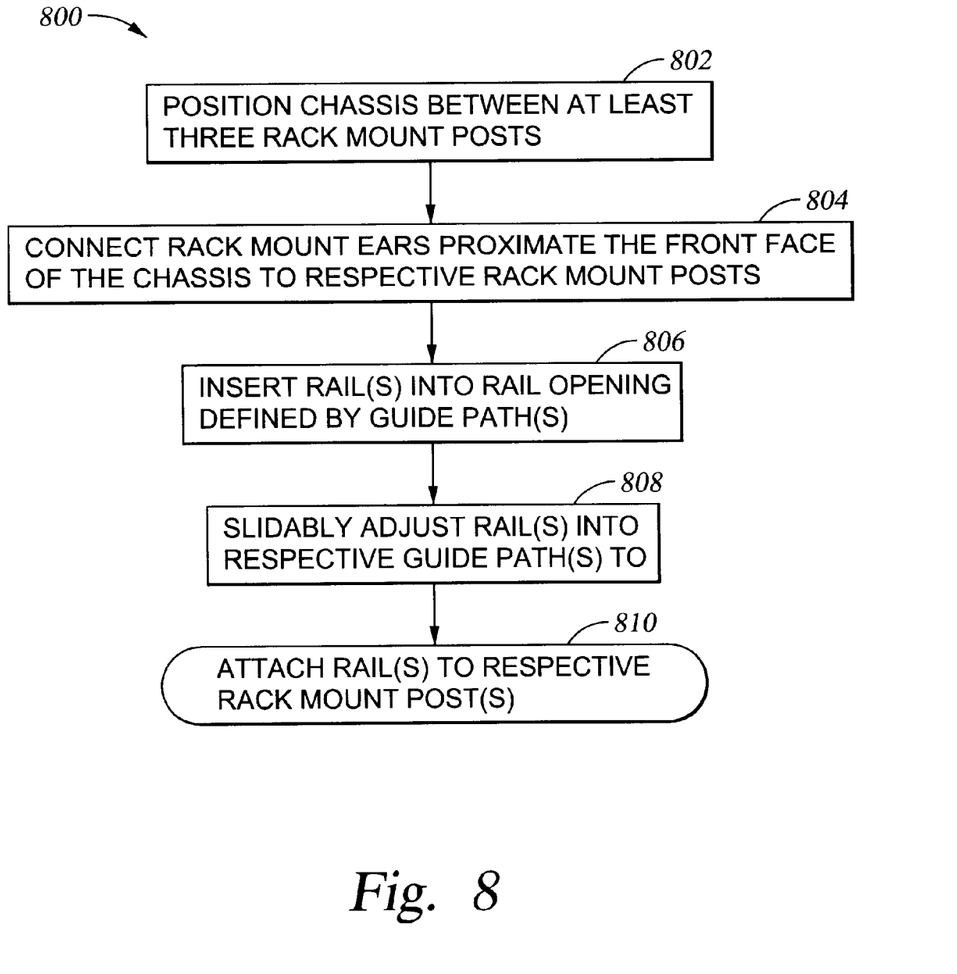
FIG. 8 is a flow chart illustrating an operational sequence for adjustably mounting a data storage chassis to rack mount posts, according to the invention.

A method of adjustably mounting the dual-rail embodiment may include the operations 800 summarized in FIG. 8. First, the chassis 100 is manually lifted and slid between the front 104 rack mount posts then moved rearward, and toward the rear posts 124 (operation 802). While continuing hold the chassis 100 and maintain support for the chassis 100, the front rack mount ears 102 are connected proximate the front face 118 of the chassis 100 to the respective front rack mount posts 104 (operation 804). As previously discussed, this operation may be achieved by aligning the rack mount ears 102 with appropriate features of the front rack mount posts 104, and thereafter inserting machine screws 106 through holes in the rack mount ears 102 into the rack mount posts 104.

Next, while continuing to support the chassis 100, which has been attached to the front rack posts 104, the rails 114 are manually inserted from behind the rear rack mount posts 124 into the rail openings 404 on the rear face 300 of the chassis 100 (operation 806). Insertion of the rails 114 from behind the rear rack posts 124 allows the adapters 122 on the exterior end 116 of the rail 114 to later be adjusted flush with the back side of the rear rack mount post 124, as discussed below. The rails 114 are then slidably urged more deeply into their respective guide paths 108 (operation 808). This operation is similar for other dual-rail guide path embodiments using a rail 114 with an adapter 122 as previously discussed, including the open bracket 112 guide path, the closed bracket 606 guide path, the roller discs 612 guide path, or the shaft 614 guide path. Referring to FIGS. 1, 2, and 4(a), the rails 114 are slidably adjusted into the guide paths 108 until the L-shaped adapter 122 at the exterior end 116 of the rail 114 is flush with the rear rack mount post 124, completing operation 808.

The adapter 122 on each of the rails 114 is then be attached to the respective rear rack mount posts (operation 810). As previously discussed, once the adapter 122 is flush with the rear rack mount post 124, the adapter 122 may be attached to the rack mount post 124 by machine screw 106 inserted through the adapter 122 and into the rear rack mount post 124, or by other secure method. While attaching the rail 114 to the rear of the rack mount post 124, the person installing the data storage chassis may stand behind the rack posts and thus more easily insert the machine screws 106 through the adapter 122 into the rear rack mount post 124.

The steps described are not exclusive, and the order of the operations may be altered. For example, the operation of inserting the rails 114 (operation 806) may occur before the operation of positioning the box-shaped chassis 100 (operation 802). As another alternative, the operation of slidably adjusting each rail 114 (operation 808) may occur before the operation of connecting the front face 118 of the chassis 100 (operation 804). In addition, the operation of attaching each rail 114 to the rear rack mount post 124 (operation 810) may occur before the operation of connecting the front face 118 of the chassis 100 (operation 804), etc.

3. Description of Single-Rail Embodiment (FIG. 5)

This embodiment generally involves an adjustable rack mount system using a single, wide rail, and will be referred to as the "single-rail embodiment."

A. Chassis

Figure 5:
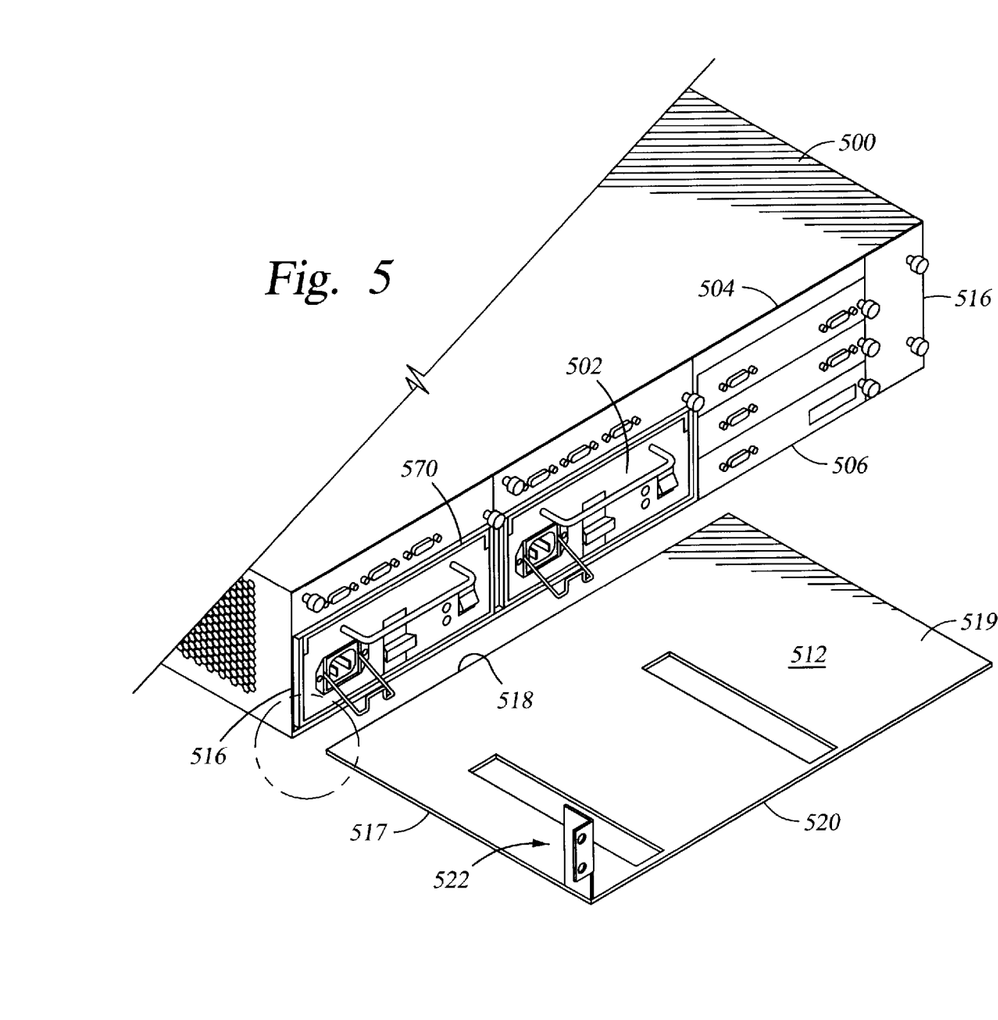
FIG. 5 is a partial rear perspective view showing a wide single rail positioned for insertion into a rail opening defined adjacent to the bottom end of the rear face of the chassis, according to the invention.

Referring to FIG. 5, the invention comprises a box-shaped chassis 500. The chassis 500 may be adjustably mounted to a set of at least three rack mount posts, including the two opposing front rack mount posts and at least one rear rack mount post, such as the posts 104, 124 shown in FIG. 1. The chassis 500 may consist of sheet metal or any other material capable of maintaining the weight of the chassis 500 contents when the chassis 500 is mounted to the front rack mount posts and at least one rear rack mount post.

Referring to FIG. 5, the rear face 502 of the chassis 500 may be open for easy access to removable storage components such as 570. The chassis 500 includes opposing top 504 and bottom 506 ends. The rear face 502 of the chassis 500 includes a rail opening 508 (FIG. 5(a)) leading to a guide path 510 that is internal to the chassis 500 as discussed below. One or both of the bottom end 506 of the chassis 500 or the shelf 514 may be perforated to disperse air as the rail 512 travels within the guide path 510, as discussed below.

B. Guide Path

Figure 5A:
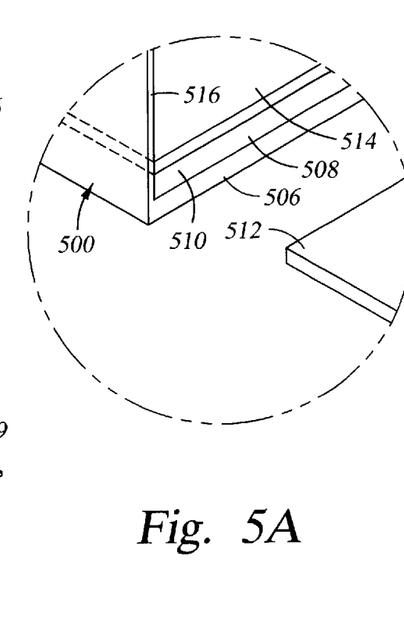
FIG. 5(a) is a partial exploded rear view of the rail opening and guide path of FIG. 5, according to the invention.

Referring to FIGS. 5—5(a), the rail opening 508 may be defined by a rail-receiving guide path 510 internal to the chassis 500. The guide path 510 is shaped to hold a single, wide rail 512 (discussed below) in place when the rail 512 is inserted into the rail opening 508. The rail 512 is partially slidably dispensed outward of the chassis 500 for attachment to a rear rack mount post, as shown in FIG. 1.

Referring to FIGS. 5 and 5(a), in this embodiment, the guide path 510 comprises a rail-receiving space between the bottom end 506 and a shelf 514 installed inside the chassis 500. The guide path 510 and rail 512 may be sized to permit snug insertion and slidable adjustment of the rail within the guide path 510. The rail opening 508 may extend to at least one side 516 of the chassis 500 (as shown) so that a lateral edge 517 of the rail 512 may be connected to a rear rack mount post.

The shelf 514 and guide path 510 permit the rail 512 to be completely detached from the chassis 500. This allows the rail 512 to be easily and fully inserted into, and removed from, the guide path 510 during mounting and demounting as discussed below.

The shelf 514 may be made of sheet metal or any other material capable of withstanding the weight of the chassis 500 when the chassis 500 is connected to the front rack mount posts, and the rail 512 is inserted inside the rail opening 508 and partially slidably dispensed outward of the chassis 500 as desired for attachment to a rear rack mount post.

An alternative guide path comprises a shelf 514 and corresponding rail opening 508 extending along the entire length of the bottom end 506 of the chassis' rear face 502. As still another alternative, the shelf 512 may be installed along the top end 504 of the chassis 500, particularly in cases where the chassis 500 will be installed above eye level within the rack mount posts, thereby permitting people to view the rear face 502.

D. Rail

The single-rail embodiment includes a single, wide rail 512, having opposing interior 518 and exterior 520 ends, and lateral edges 517, 519. The rail 512 may be perforated for airflow, so that as the rail 512 is inserted into the guide path 510, air is displaced and the rail 512 may be more easily adjusted. The rail 512 may be made of sheet metal or any other material capable of maintaining the weight of the chassis 500 when the chassis 500 is connected to the front rack posts, and the rail 512 is partially extended out of the guide path 510.

When inserted inside the rail opening 508, the rail 512 slidably resides within its guide path 510. The thickness of the rail 512 may correspond to the full dimension of the guide path 510 as defined by aperture between the shelf 514 and bottom 506. The rail 512 may be deep enough between interior and exterior ends 518/520 so that when the front face of the chassis 500 is connected to front rack mount posts, and the rail 512 is partially extended out of the guide path 510, the rail 512 keeps the chassis 500 supported and level. Alternatively, more than one rail 512 may be used with multiple, corresponding, guide paths 510 at either the bottom 506 or top 504 end of the chassis 500.

D. Adapter For Attachment To Rack Mount Post

The exterior end 520 of the rail 512 may be adapted for attachment to a rear rack mount post, such as the post 124 of FIGS. 1, 4(a). Specifically, as shown in FIG. 5, the exterior end 520 may include an L-shaped adapter 522 positioned at the lateral edge 517 of the rail 512 to permit slidable adjustment of the adapter 522 flush with a rear rack mount post. Thereafter, the L-shaped adapter 522 may be attached to the rack mount post 124 by machine screw inserted through the L-shaped adapter 522 and into the rear rack mount post, or by other secure method. Alternatively, the adapter 522 may comprise pins, rods, bolts, built-in screws, brackets, sliding collars, or any other mechanism that securely attaches the rail 512 to a rear rack mount post. Alternatively, the rear rack mount post itself may be modified with pins, rods, bolts, built-in screws, clips, brackets, sliding collars, slits, holes, or any other mechanism that allows the exterior 520 or a lateral 517/519 position of the rail 512 to securely couple with a rear rack mount post and thereby support the chassis 500.

Referring to FIG. 1, as with the dual-rail embodiment, other adapters such as rack mount ears 102 may be used to attach the front face of the chassis 500 to respective front rack mount posts 104, as mentioned above.

4. Operation of Single Rail Embodiment (FIG. 8)

Having described the structural features of the single-rail embodiment of the invention, the method aspect of this embodiment will now be described.

A method of adjustably mounting this embodiment may include the operations 800 summarized in FIG. 8. First, in operation 802 the chassis 500 is manually lifted and slid between the front rack mount posts (such as 104, FIG. 1), and then moved rearward toward the rear posts (such as 124, FIG. 1). While holding the chassis 500 to maintain support for the chassis 500, front rack mount ears (such as 102, FIG. 1) proximate the front face 118 of the chassis 500 are connected to the respective front rack mount posts (operation 804). As previously discussed, this operation may be achieved by aligning the rack mount ears with appropriate features of the front of the rack mount posts, and thereafter inserting machine screws through holes in the rack mount ears into the rack mount post. Next, while continuing to support the chassis 500, which has been attached to the front rack posts, the single rail 512 is manually inserted from behind the rear rack mount posts into the rail opening 508 near the bottom end 506 of the chassis 500 (operation 806).

Insertion of the rail 512 from behind the rear rack mount posts allows the L-shaped adapter 522 at the exterior end 520 of the rail 512 to later be adjusted flush with the rear rack mount post (operation 808).

The adapter 522 on the rail 512 may then be attached to a rear rack mount post (operation 810). As previously discussed, once the adapter 522 is flush with the rear rack mount post, the adapter 522 may be attached to the rack mount post 124 by machine screw inserted through the adapter 522 and into the rear rack mount post, or other secure method. While attaching the rail 512 to the rear of the rack mount post, the person installing the data storage chassis may stand behind the rack mount posts and thus more easily insert the machine screws through the adapter 522 into the rear rack mount post.

The steps described are not exclusive, and the order of the operations may be altered. For example, the operation of inserting the rail 512 (operation 806) may occur before the operation of positioning the chassis 500 (operation 802). As another alternative, the operation of slidably adjusting each rail 512 (operation 808) may occur before the operation of connecting the front face 118 of the chassis 500 (operation 804). In addition, the operation of attaching the rail 512 to a rear rack mount post 124 (operation 810) may occur before the operation of connecting the front face 118 of the chassis 500 (operation 804).

Other Embodiments

While the foregoing disclosure shows a number of illustrative embodiments of the invention, it will be apparent to those skilled in the art that various changes and modifications can be made herein without departing from the scope of the invention as defined by the appended claims. Furthermore, although elements of the invention may be described or claimed in the singular, the plural is contemplated unless limitation to the singular is explicitly stated. Additionally, ordinarily skilled artisans will recognize that operational sequences must be set forth in some specific order for the purpose of explanation and claiming, but the present invention contemplates various changes beyond such specific order.

What is claimed is:

1. An adjustable rack mountable storage enclosure, comprising:
    a box-shaped chassis having opposing front and rear faces, each of the faces having opposing sides and opposing top and bottom ends, the rear face having at least one rail opening defined therein, the chassis including one guide path coupled to each rail opening and connected to the chassis; and
    at least one rail, each rail having opposing interior and exterior ends, each rail being shaped for slidable, removable insertion into one of the guide paths, each rail's exterior end including a respective adapter attachable to a predefined rack mount post.

2. The apparatus of claim 1, where each guide path comprises one or more open brackets.

3. The apparatus of claim 1, where each guide path comprises one or more closed brackets.

4. The apparatus of claim 1, where each guide path comprises one or more roller discs.

5. The apparatus of claim 1, where each guide path comprises at least one solid shaft.

6. The apparatus of claim 1, where each guide path defines perforations therein.

7. The apparatus of claim 1, where the rear face defines two rail openings therein adjacent respective opposing sides of the chassis, and the at least one rail comprises opposing first and second rails.

8. The apparatus of claim 1, where the rear face defines one rail opening adjacent to the bottom end of the rear face of the chassis, and the at least one rail comprises a single rail.

9. The apparatus of claim 1, where the exterior end of each rail includes an L-shaped adapter.

10. The apparatus of claim 1, where each rail defines perforations therein.

11. The apparatus of claim 1, where each rail comprises an elongated rail shaped to slidably reside within the guide path.

12. The apparatus of claim 1, where each rail comprises an elongated rail, shaped to wrap around the guide path.

13. The apparatus of claim 1, where the at least one rail comprises a single rail substantially spanning between the opposing sides.

14. The apparatus of claim 1, where the at least one rail comprises a single rail of less width than the distance between the opposing sides of the chassis.

15. A modular storage system, comprising:
   a box-shaped chassis having opposing front and rear faces, each of the faces having opposing sides and opposing top and bottom ends, the rear face having at least one rail opening defined therein, the chassis including one guide path coupled to each rail opening and connected to the chassis;
   at least one rail, each rail having opposing interior and exterior ends, each rail being shaped for slidable, removable insertion into one of the guide paths, each rail's exterior end including a respective adapter for attachment to a predefined rack mount post; and
   at least three rack mount posts including two front rack mount posts and at least one rear rack mount post positioned about the chassis, the front rack mount posts being attached to the chassis proximate the front face, where the exterior end of each rail is attached to one of the rear rack mount posts.

16. An adjustable rack mountable enclosure, comprising:
   a box-shaped chassis having opposing front and rear faces interconnected by opposing lateral sides and opposing top and bottom sides, the rear face having at least one rail opening defined therein, the chassis including one guide path coupled to each rail opening and affixed internally to the chassis; and
   for each guide path, an elongated rail slidably and removably coupled to said guide path, each rail having opposing interior and exterior ends where the exterior end includes a respective connecting feature compatible with a predefined rack mount post.

17. A method of mounting an adjustable rack mountable storage enclosure comprising a box-shaped chassis having opposing front and rear faces, the chassis including at least one guide path internal to the chassis in communication with corresponding rail opening, the enclosure also including at least one rail slidably coupled to a corresponding one of the guide paths, each rail including opposing interior and exterior ends, said method comprising the operations of:
   positioning the chassis between rack mount posts, including two front rack mount posts and at least one rear rack mount post where a distance between the front and rear rack mount posts exceeds a length between the front and rear faces;
   connecting the front face to the front rack mount posts;
   inserting the interior end of each rail into the rail's corresponding guide path;
   slidably adjusting each of the rails within its corresponding guide path to align each exterior end with one of the rear rack mount posts; and
   attaching each of the rails to one of the rear rack mount posts.

18. The method of claim 17, where the inserting operation occurs before the positioning operation.

19. The method of claim 17, where the adjusting operation occurs before the connecting operation.

20. The method of claim 17, where the attaching operation occurs before the connecting operation.

* * * * *